United States Patent
Chen et al.

(10) Patent No.: US 9,854,706 B2
(45) Date of Patent: Dec. 26, 2017

(54) HEAT SINK

(71) Applicant: AURAS Technology Co., Ltd., New Taipei (TW)

(72) Inventors: Hong-Long Chen, New Taipei (TW); Chien-Jiu Chou, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/196,641

(22) Filed: Jun. 29, 2016

(65) Prior Publication Data

US 2017/0290199 A1 Oct. 5, 2017

Related U.S. Application Data

(60) Provisional application No. 62/316,954, filed on Apr. 1, 2016.

(30) Foreign Application Priority Data

May 23, 2016 (TW) .............................. 105115970 A (51) Int. Cl.
*F28F 7/00* (2006.01)
*H05K 7/20* (2006.01)

(52) U.S. Cl.
CPC ................. *H05K 7/20336* (2013.01)

(58) Field of Classification Search
CPC ............. F28F 1/34; F28F 3/02; F28F 2215/10
USPC ...................................... 165/80.3, DIG. 461
See application file for complete search history.

(56) References Cited

U.S. PATENT DOCUMENTS

| | | | | |
|---|---|---|---|---|
| 5,709,263 A * | 1/1998 | Mira | .......................... | F28F 3/02 165/185 |
| 5,957,194 A * | 9/1999 | Azar | .......................... | F28F 3/02 165/185 |
| 8,235,094 B2 * | 8/2012 | Wayman | .................... | F28F 3/06 165/185 |
| 2004/0244947 A1 * | 12/2004 | Chen | ......................... | F28F 3/04 165/80.3 |
| 2005/0252642 A1 * | 11/2005 | Chang | ................. | H01L 23/3672 165/80.3 |
| 2006/0096737 A1 * | 5/2006 | Kimura | .................. | H01L 23/473 165/80.3 |
| 2008/0295994 A1 * | 12/2008 | Lee | ............................ | F28F 3/02 165/80.3 |
| 2008/0314555 A1 * | 12/2008 | Wu | ....................... | F28D 15/0266 165/80.3 |

(Continued)

*Primary Examiner* — Gordon Jones
(74) *Attorney, Agent, or Firm* — WPAT, PC (57) ABSTRACT

A heat sink includes a bottom surface, a top surface, plural first fins and plural second fins. The plural first fins and the plural second fins are alternately and separately arranged between the top surface and the bottom surface along a specified axis direction. Moreover, plural airflow channels are defined by the plural first fins, the plural second fins, the top surface and the bottom surface collaboratively. The first fin has a first non-overlapped zone and a second non-overlapped zone with respect to a projection area of the second fin along the specified axis direction. The first non-overlapped zone is located at an airflow inlet. In the first non-overlapped zone, the lower portion is wider than the upper portion. The second non-overlapped zone is located at an airflow outlet. In the second non-overlapped zone, the upper portion is wider than the lower portion.

6 Claims, 11 Drawing Sheets (56) References Cited

U.S. PATENT DOCUMENTS

2010/0246136 A1\* 9/2010 Yu .................... H01L 23/367
361/710

\* cited by examiner

HEAT SINK

CROSS-REFERENCE TO RELATED APPLICATION

This application claims priority to U.S. Provisional Patent Application No. 62/316,954 entitled "INTERLACED FINS HEAT DISSIPATING DEVICE" filed Apr. 1, 2016, the contents of which are incorporated herein by reference.

FIELD OF THE INVENTION

The present invention relates to a heat sink, and more particularly to a fin-type heat sink.

BACKGROUND OF THE INVENTION

With increasing performance of the electronic devices, various heat dissipating structures or heat dissipating devices for the electronic devices are developed vigorously. For example, a fin-type heat sink is one of the widely-used heat dissipating devices. The fins of the fin-type heat sink usually have the same specification and are orderly arranged. Generally, the heat dissipating efficiency of the fin-type heat sink is positively correlated with the heat transfer area of the fins. Recently, the general trends in designing the heat dissipating devices are toward small size and light weightiness. In other words, it is important to increase the heat dissipating efficiency while meeting the requirement of small size and light weightiness.

For example, a fin-type heat sink was disclosed in Taiwanese Utility Model Patent No. M270414, which was filed by the same assignee of the present application. In this patent, two kinds of fins with different sizes are alternately arranged along a specified direction. Since the wind resistance at the airflow inlet is reduced, the ambient airflow can be introduced into the heat sink more easily. That is, this fin-type heat sink has enhanced heat dissipating efficiency and reduced weightiness. Although the design of alternately arranging different kinds of fins can overcome the drawbacks of the conventional technologies, the fin-type heat sink needs to be further improved. For example, it is important to introduce the ambient airflow into the heat sink more easily while guiding the airflow to the heated surfaces to remove the heat from the heat generation components. Moreover, after the airflow is introduced into the heat sink, it is important to guide the airflow to be away from the heated surface and the heat sink more quickly in order to enhance the heat dissipating efficiency.

SUMMARY OF THE INVENTION

For overcoming the drawbacks of the conventional technologies, the present invention provides a heat sink for facilitating introducing the ambient airflow, guiding the airflow to the heated surface and efficiently removing the heat from the heat generation component.

For overcoming the drawbacks of the conventional technologies, the present invention provides a heat sink for guiding the introduced airflow to get away the heated surface and the heat sink in order to enhance the heat dissipating efficiency.

In accordance with an aspect of the present invention, there is provided a heat sink. The heat sink is connected with a heated surface of a heat generation component. An ambient airflow flows into the heat sink to remove heat from the heat generation component. The heat sink includes a bottom surface, a top surface, plural first fins and plural second fins. The bottom surface is close to the heated surface. The top surface is away from the heated surface and opposed to the bottom surface. The plural first fins and the plural second fins are alternately and separately arranged between the top surface and the bottom surface along a specified axis direction. Moreover, plural airflow channels are defined by the plural first fins, the plural second fins, the top surface and the bottom surface collaboratively. Each airflow channel includes an airflow inlet and an airflow outlet. An area of the first fin is larger than an area of the second fin. The first fin has a first non-overlapped zone and a second non-overlapped zone with respect to a projection area of the second fin along the specified axis direction. The first non-overlapped zone is located at the airflow inlet. A first width of the first non-overlapped zone near the heated surface is larger than a second width of the first non-overlapped zone away from the heated surface. The second non-overlapped zone is located at the airflow outlet. A first width of the second non-overlapped zone near the heated surface is smaller than a second width of the second non-overlapped zone away from the heated surface.

In an embodiment, a first space at the airflow inlet is defined by each second fin and two adjacent first fins collaboratively, and a second space at the airflow outlet is defined by each second fin and two adjacent first fins collaboratively. After the ambient airflow flows into the heat sink through the first space, the ambient airflow is guided to the heated surface. After the ambient airflow passes through the heat sink, the ambient airflow is away from the heated surface through the second space.

In an embodiment, the first fins and the second fins include plural bent structures, and the bottom surface and the top surface are defined by the plural bent structures collaboratively.

In an embodiment, the first fins are rectangular fins, and the second fins are parallelogram-shaped fins with no right angles.

In an embodiment, the heat sink further includes at least one heat pipe, and the at least one heat pipe is penetrated through and connected with the plural first fins and the plural second fins.

In an embodiment, a first end of the heat pipe is near the heated surface, and a second end of the heat pipe is away from the heated surface.

In accordance with another aspect of the present invention, there is provided a heat sink. The heat sink is connected with a heated surface of a heat generation component. An ambient airflow flows into the heat sink to remove heat from the heat generation component. The heat sink includes a bottom surface, a top surface, plural first fins and plural second fins. The bottom surface is close to the heated surface. The top surface is away from the heated surface and opposed to the bottom surface. A central cross section is between the top surface and the bottom surface. A distance between the top surface and the central cross section is equal to a distance between the bottom surface and the central cross section. The plural first fins and the plural second fins alternately and separately arranged between the top surface and the bottom surface along a specified axis direction. Moreover, plural airflow channels are defined by the plural first fins, the plural second fins, the top surface and the bottom surface collaboratively. Each airflow channel includes an airflow inlet and an airflow outlet. An area of the first fin is larger than an area of the second fin. The first fin has a first non-overlapped zone and a second non-overlapped zone with respect to a projection area of the second fin along the specified axis direction. The first non-overlapped zone is located at the airflow inlet. The second non-overlapped zone is located at the airflow outlet. The first non-overlapped zone is divided into a first region and a second region by the central cross section. The first region is located near the bottom surface. The second region is located near the top surface. An area of the first region is larger than an area of the second region. The second non-overlapped zone is divided into a third region and a fourth region by the central cross section. The third region is located near the bottom surface. The fourth region is located near the top surface. An area of the third region is smaller than an area of the fourth region.

In an embodiment, a first space at the airflow inlet is defined by each second fin and two adjacent first fins collaboratively. A second space at the airflow outlet is defined by each second fin and two adjacent first fins collaboratively. After the ambient airflow flows into the heat sink through the first space, the ambient airflow is guided to the heated surface. After the ambient airflow passes through the heat sink, the ambient airflow is away from the heated surface through the second space.

In an embodiment, the first fins and the second fins include plural bent structures, and the bottom surface and the top surface are defined by the plural bent structures collaboratively.

In an embodiment, the first fins are rectangular fins, and the second fins are parallelogram-shaped fins with no right angles.

In an embodiment, the heat sink further includes at least one heat pipe, and the at least one heat pipe is penetrated through and connected with the plural first fins and the plural second fins.

In an embodiment, a first end of the heat pipe is near the heated surface, and a second end of the heat pipe is away from the heated surface.

From the above descriptions, the present invention provides the heat sink. Due to the first non-overlapped zone and the second non-overlapped zone, the inlet pressure drop in the first space and the outlet pressure drop in the second space are reduced. Consequently, the velocity and flowrate of the ambient airflow are increased, and the heat transfer coefficient of the heat sink is enhanced. Moreover, since the velocity and flowrate of the ambient airflow are increased, the heat sink can further comprise the second fin group to increase the overall heat transfer area of the heat sink, or the heat sink can further comprise plural heat pipes to increase the thermal conductivity of the heat sink and the overall heat dissipating efficiency of the heat sink. Moreover, the first non-overlapped zone is includes in the first space and located near the heated surface, and the second non-overlapped zone is included in the second space and located away from the heated surface. Consequently, the ambient airflow can be guided by the heat sink. After the ambient airflow passes through the heat sink, the ambient airflow is guided to be away from the heated surface and out of the heat sink. In the second space with higher temperature, the ambient airflow is contacted with the first fins, the second fins and the heated surface. Consequently, the overall heat dissipating efficiency is enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides a heat sink. For well understanding the concepts of the present invention, three axis directions in the three-dimensional coordination system are defined as follows. The X-axis direction indicates the direction along the front side and rear side of the heat sink. The Y-axis direction indicates the direction along the left side and the right side of the heat sink. In accordance with the present invention, different kinds of fins are alternately arranged along the Y-axis direction. The Z-axis direction indicates the direction along the upside and the downside of the heat sink. In the following descriptions, the heat generation component is located at the downside of the heat sink. It is noted that the position of the heat generation component is not restricted.

Figure 1A:
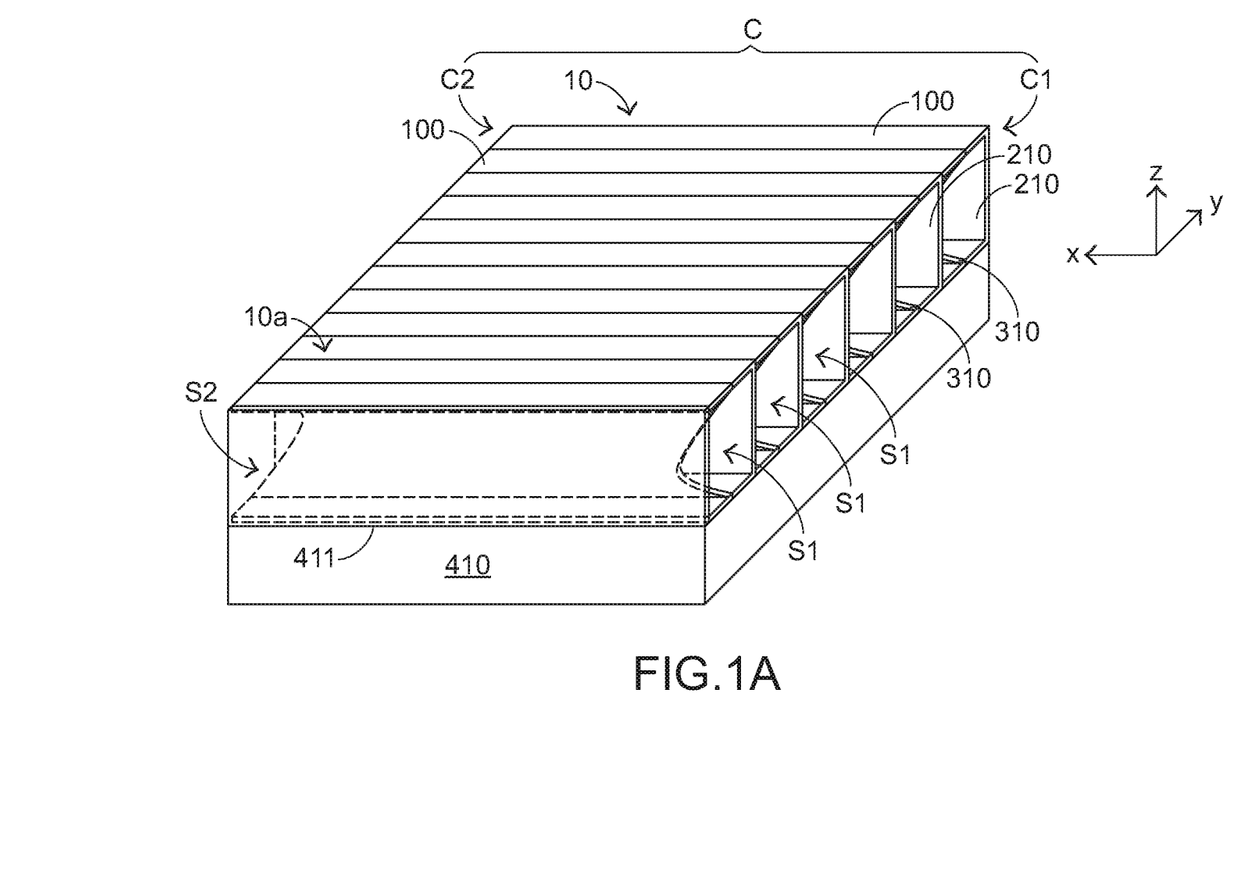
FIG. 1A is a schematic perspective view illustrating a heat sink according to a first embodiment of the present invention.
Figure 1B:
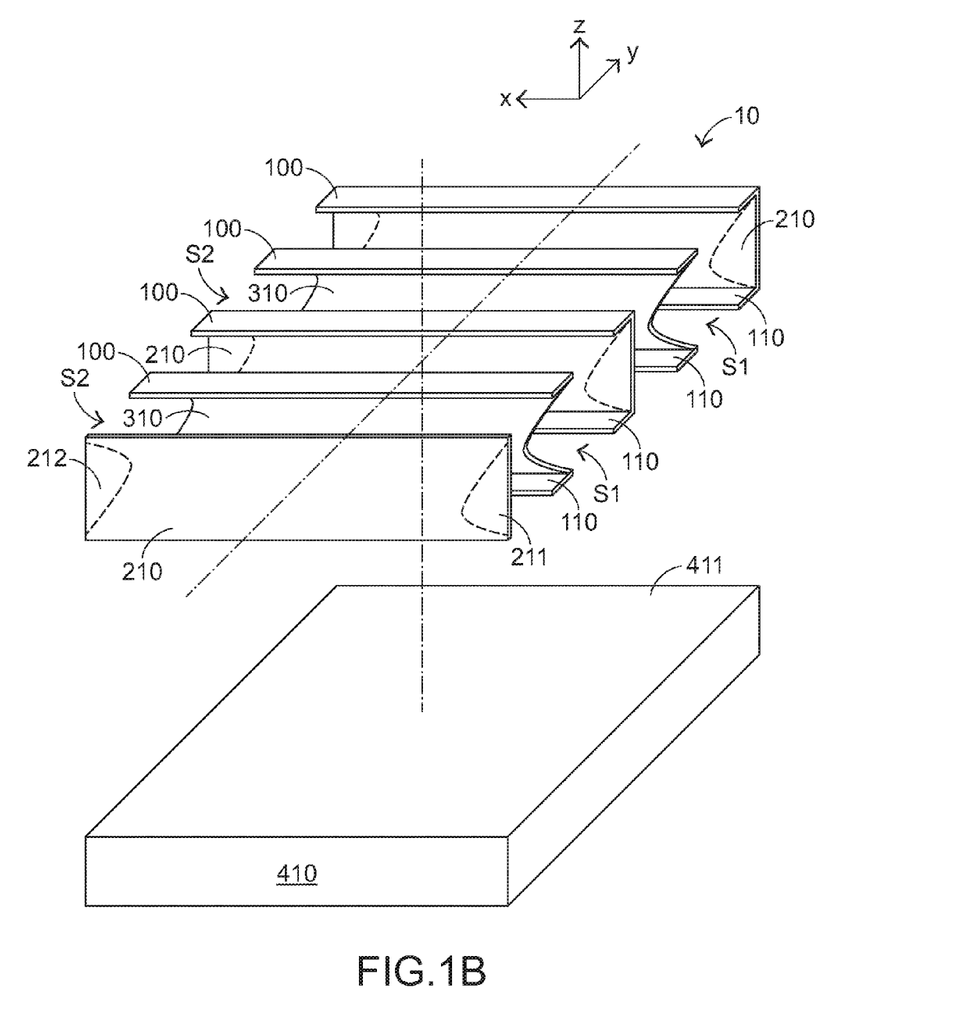
FIG. 1B is a schematic exploded view illustrating a portion of the heat sink of FIG. 1A.
Figure 1C:
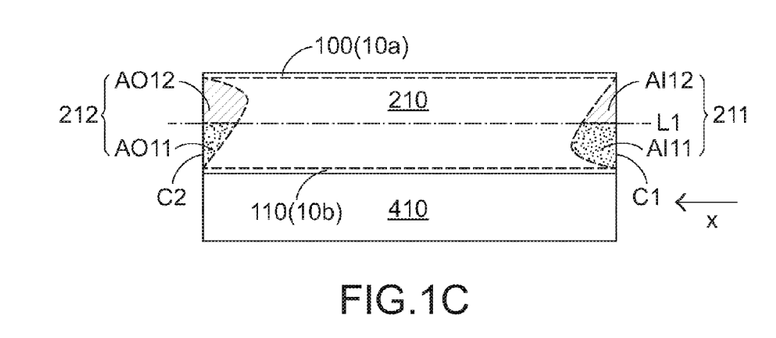
FIG. 1C is a schematic side view illustrating a first non-overlapped zone and a second non-overlapped zone of the larger first fin with respect to the projection area of the smaller second fin along the Y-axis direction according to the first embodiment of the present invention.
Figure 1D:
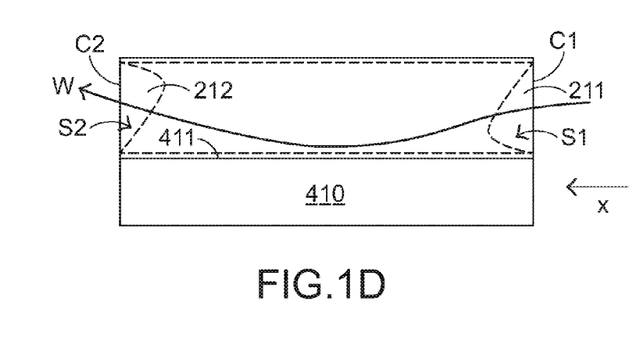
FIG. 1D is a schematic side view illustrating the path of the ambient airflow passing through the heat sink according to the first embodiment of the present invention.

FIG. 1A is a schematic perspective view illustrating a heat sink according to a first embodiment of the present invention. FIG. 1B is a schematic exploded view illustrating a portion of the heat sink of FIG. 1A. FIG. 1C is a schematic side view illustrating a first non-overlapped zone and a second non-overlapped zone of the larger first fin with respect to the projection area of the smaller second fin along the Y-axis direction according to the first embodiment of the present invention. FIG. 1D is a schematic side view illustrating the path of the ambient airflow passing through the heat sink according to the first embodiment of the present invention.

Please refer to FIGS. 1A-1D. The heat sink 10 is connected with a heated surface 411 of a heat generation component 410. The heat sink 10 comprises a top surface 10a, a bottom surface 10b, plural first fins 210 and plural second fins 310. The bottom surface 10b is close to the heated surface 411. The top surface 10a is away from the heated surface 411 and opposed to the bottom surface 10b. The plural first fins 210 and the plural second fins 310 are alternately and separately arranged between the top surface 10a and the bottom surface 10b along the Y-axis direction. The alternate arrangement indicates that the plural first fins 210 and the plural second fins 310 are respectively in the odd-numbered positions and the even-numbered positions or the plural first fins 210 and the plural second fins 310 are respectively in the even-numbered positions and the odd-numbered positions. Moreover, there is a spacing interval (or a gap) between every two adjacent fins. In this embodiment, the gap is defined by the bent structures 100 and 110 of the fin 210 or 310. Alternatively, plural gaps are arranged between the fins at a specified distance through adhesives or soldering materials. Moreover, plural bent structures 100 are contacted with each other to define the top surface 10a of the heat sink 10, and plural bent structures 110 are contacted with each other to define the bottom surface 10b of the heat sink 10.

Please refer to FIGS. 1A-1D again. As mentioned above, the plural first fins 210 and the plural second fins 310 are alternately and separately arranged between the top surface 10a and the bottom surface 10b along the Y-axis direction. Consequently, plural airflow channels C are defined by the plural first fins 210, the plural second fins 310, the top surface 10a and the bottom surface 10b collaboratively. The airflow channel C comprises an airflow inlet C1 and an airflow outlet C2. The ambient airflow flows into the heat sink 10 through the airflow inlet C1 and flows out of the heat sink 10 through the airflow outlet C2. Moreover, as shown in FIG. 1C, a central cross section L1 is arranged between the top surface 10a and the bottom surface 10b of the heat sink.

Please refer to FIGS. 1A-1D again. The area of the first fin 210 is larger than the area of the second fin 310. In the side view of the assembled heat sink 10, the first fin 210 has a first non-overlapped zone 211 and a second non-overlapped zone 212 with respect to the projection area of the second fin 310 along the Y-axis direction. In case that the first fin 210 and the second fin 310 are stacked on each other, the first non-overlapped zone 211 and the second non-overlapped zone 212 are extra areas of the first fin 210 with respect to the second fin 310, or the first non-overlapped zone 211 and the second non-overlapped zone 212 are deficient areas of the second fin 310 with respect to the first fin 210. It is noted that the deficient areas are not resulted from the notches or concave structures of the second fin 310. That is, after the plural first fins 210 and the plural second fins 310 are alternately arranged, the second fin 310 has the deficient areas with respect to the first area 210. For succinctness, the first non-overlapped zone 211 and the second non-overlapped zone 212 are defined as the non-overlapped zones of the first fin 210 with respect to the second fin 310. In accordance with a feature of the present invention, the first non-overlapped zone 211 is located at the airflow inlet C1, and the second non-overlapped zone 212 is located at the airflow outlet C2. The first non-overlapped zone 211 is divided into a first region AI11 and a second region AI12 by the central cross section L1. The first region AI11 is located near the bottom surface 10b. The second region AI12 is located near the top surface 10a. Moreover, the area of the first region AI11 is larger than the area of the second region AI12. The second non-overlapped zone 212 is divided into a third region AO11 and a fourth region AO12 by the central cross section L1. The third region AO11 is located near the bottom surface 10b. The fourth region AO12 is located near the top surface 10a. Moreover, the area of the third region AO11 is smaller than the area of the fourth region AO12.

Please refer to FIGS. 1A~1D again. Moreover, a first space S1 at the airflow inlet C1 is defined by each second fin 310 and its two adjacent first fins 210 collaboratively. After the ambient airflow W flows into the heat sink 10 through the first space S1, the ambient airflow W is guided to the heated surface 411. Moreover, a second space S2 at the airflow outlet C2 is defined by each second fin 310 and its two adjacent first fins 210 collaboratively. After the ambient airflow W passes through the heat sink 10, the ambient airflow W is away from the heated surface 411 through the second space S2. The path of the ambient airflow W can be seen in FIG. 1D.

Figure 2A:
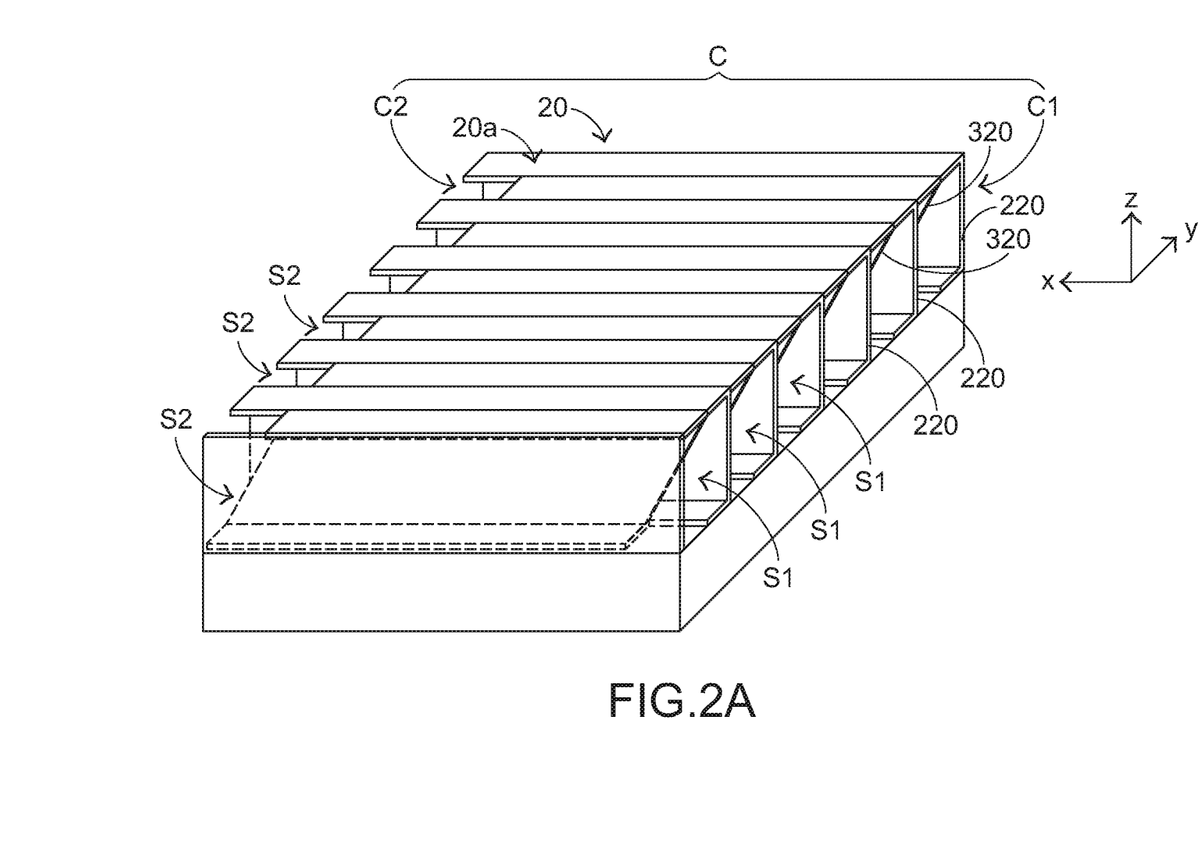
FIG. 2A is a schematic perspective view illustrating a heat sink according to a second embodiment of the present invention.
Figure 2B:
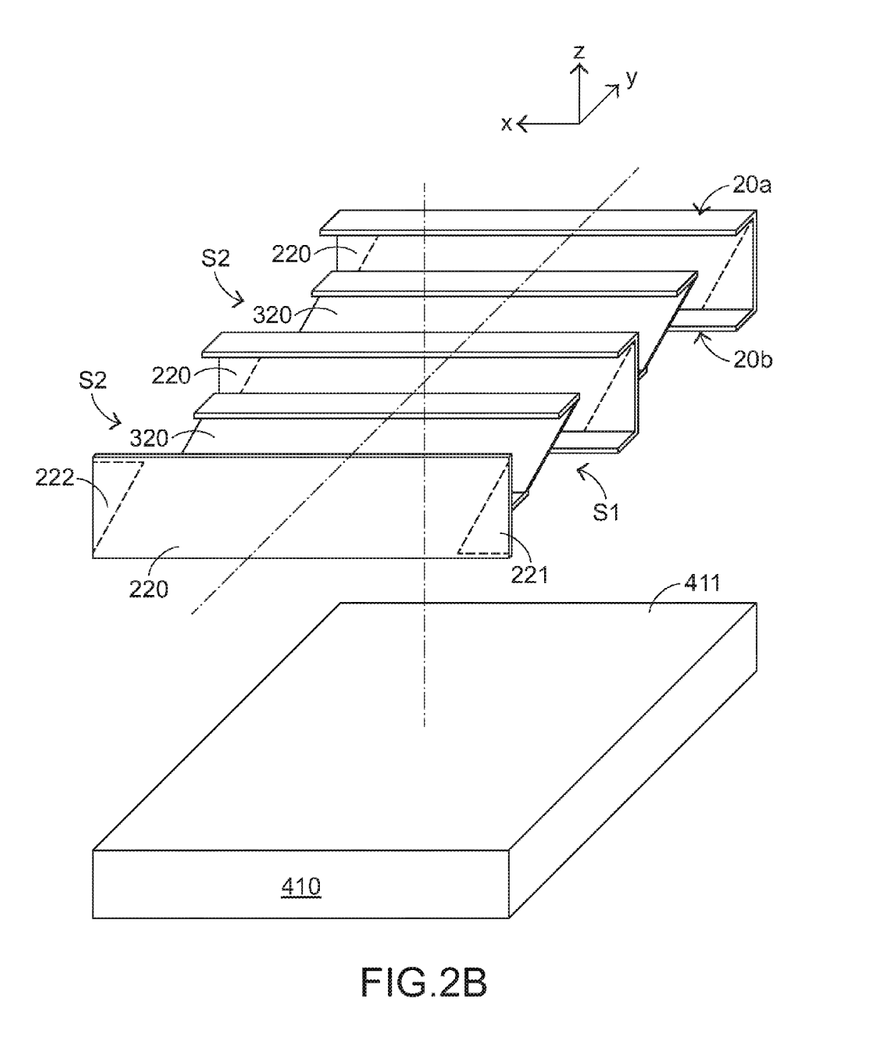
FIG. 2B is a schematic exploded view illustrating a portion of the heat sink of FIG. 2A.
Figure 2C:
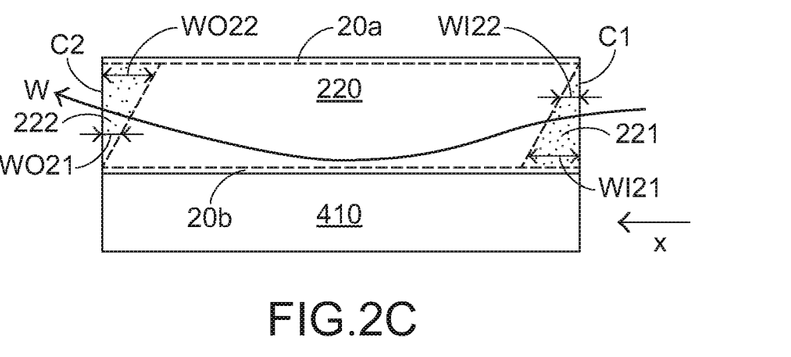
FIG. 2C is a schematic side view illustrating a first non-overlapped zone and a second non-overlapped zone of the larger first fin with respect to the projection area of the smaller second fin according to the second embodiment of the present invention.

The present invention further provides a second embodiment to provide another design of the non-overlapped zones. This embodiment is also suitable for the fin-type heat sink with the concaved fins. FIG. 2A is a schematic perspective view illustrating a heat sink according to a second embodiment of the present invention. FIG. 2B is a schematic exploded view illustrating a portion of the heat sink of FIG. 2A. FIG. 2C is a schematic side view illustrating a first non-overlapped zone and a second non-overlapped zone of the larger first fin with respect to the projection area of the smaller second fin according to the second embodiment of the present invention. In this embodiment, the first fin is a rectangular fin, and the second fin is a parallelogram-shaped fin with no right angles.

Please refer to FIGS. 2A~2C. In this embodiment, the heat sink 20 is contacted with a heated surface 411 of a heat generation component 410. The heat sink 20 comprises a top surface 20a, a bottom surface 20b, plural first fins 220 and plural second fins 320. The bottom surface 20b is close to the heated surface 411. The top surface 20a is away from the heated surface 411 and opposed to the bottom surface 20b. The plural first fins 220 and the plural second fins 320 are alternately and separately arranged between the top surface 20a and the bottom surface 20b along the Y-axis direction. Consequently, plural airflow channels C are defined by the plural first fins 220, the plural second fins 320, the top surface 20a and the bottom surface 20b collaboratively. The airflow channel C comprises an airflow inlet C1 and an airflow outlet C2. The first non-overlapped zone 221 is located at the airflow inlet C1, and the second non-overlapped zone 222 is located at the airflow outlet C2. In this embodiment, the width WI21 of the first non-overlapped zone 221 near the heated surface 411 is larger than the width WI22 of the first non-overlapped zone 221 away from the heated surface 411. Moreover, the width WO21 of the second non-overlapped zone 222 near the heated surface 411 is smaller than the width WO22 of the second non-overlapped zone 222 away from the heated surface 411.

Moreover, a first space S1 at the airflow inlet C1 is defined by each second fin 320 and its two adjacent first fins 220 collaboratively. After the ambient airflow W flows into the heat sink 20 through the first space S1, the ambient airflow W is guided to the heated surface 411. Moreover, a second space S2 at the airflow outlet C2 is defined by each second fin 320 and its two adjacent first fins 220 collaboratively. After the ambient airflow W passes through the heat sink 20, the ambient airflow W is guided to be away from the heated surface 411 through the second space S2. The path of the ambient airflow W can be seen in FIG. 2C.

It is noted that numerous modifications and alterations may be made while retaining the teachings of the invention. For example, in another embodiment, the heat sink is further equipped with at least one heat pipe to increase the heat dissipating efficiency.

Figure 3A:
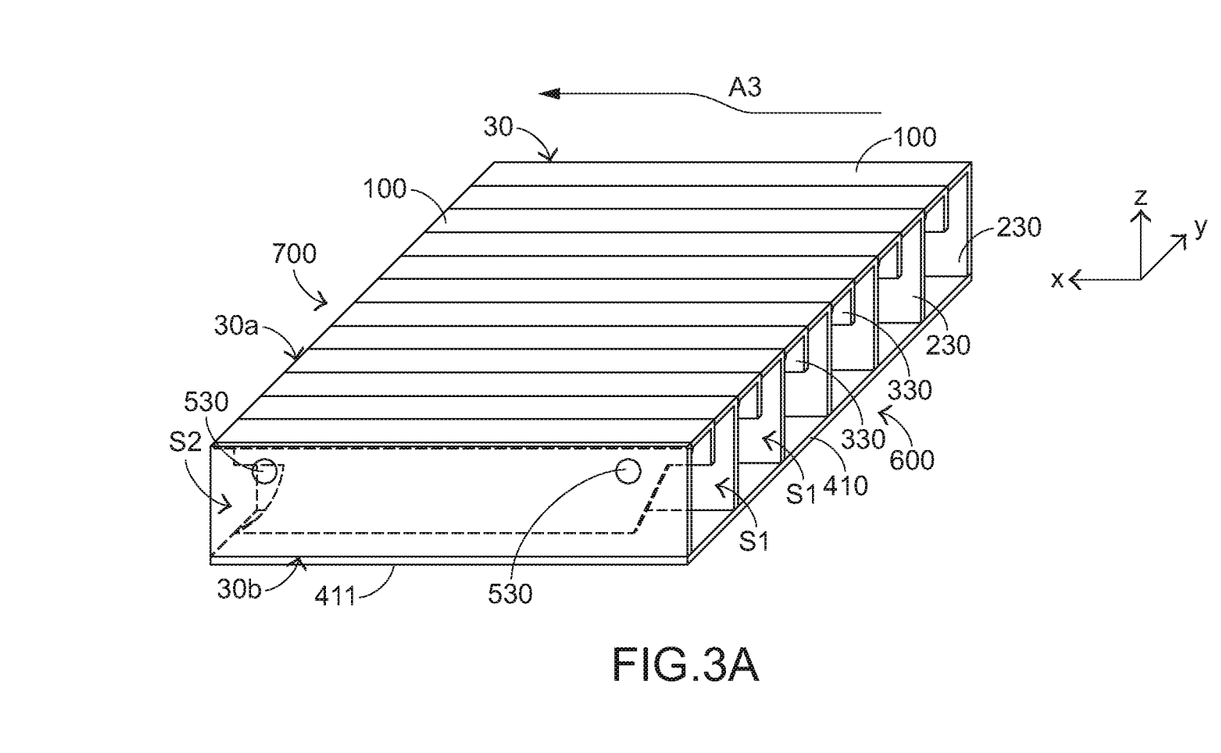
FIG. 3A is a schematic perspective view illustrating a heat sink with heat pipes according to a third embodiment of the present invention.
Figure 3B:
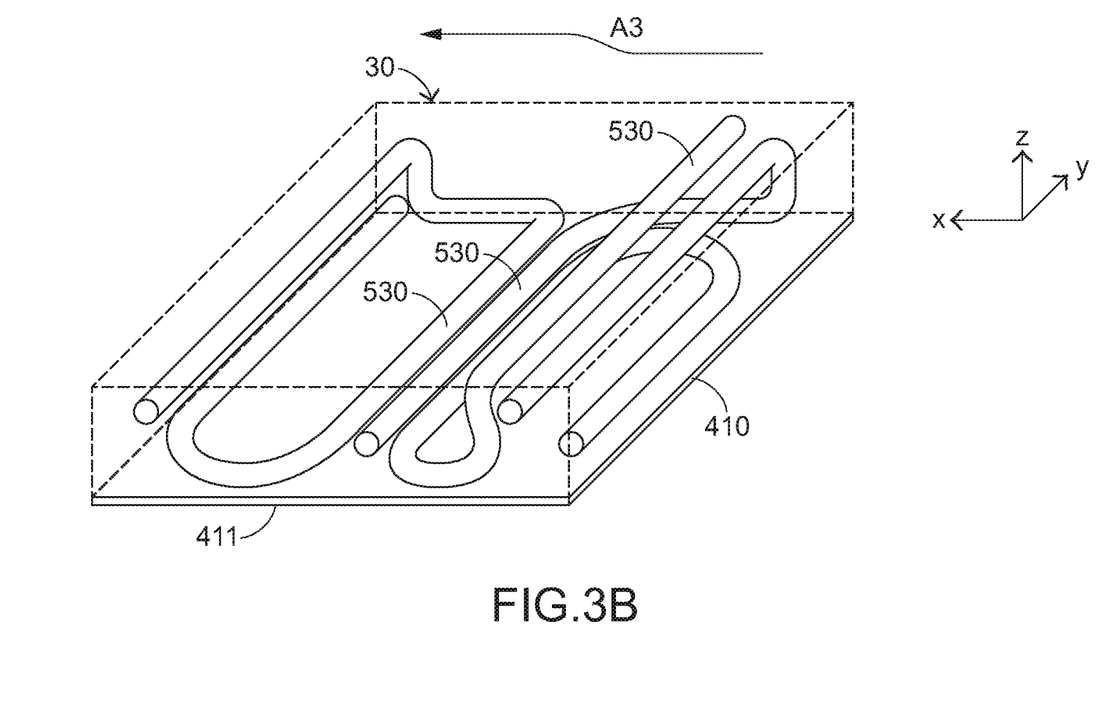
FIG. 3B schematically illustrates a portion of the interior of the heat sink of FIG. 3A.
Figure 3C:
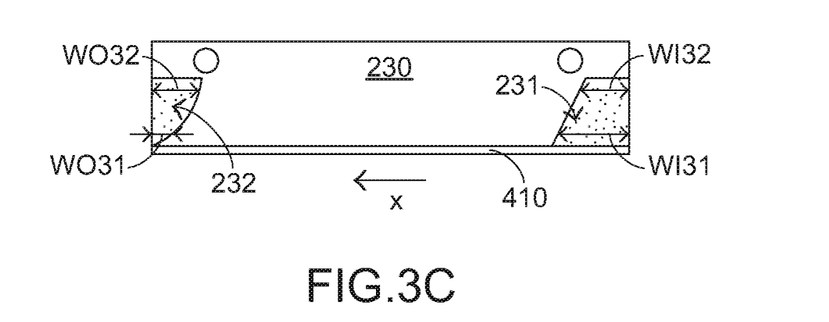
FIG. 3C is a schematic side view illustrating a first non-overlapped zone and a second non-overlapped zone of the heat sink according to the third embodiment of the present invention.

FIG. 3A is a schematic perspective view illustrating a heat sink with heat pipes according to a third embodiment of the present invention. FIG. 3B schematically illustrates a portion of the interior of the heat sink of FIG. 3A. FIG. 3C is a schematic side view illustrating a first non-overlapped zone and a second non-overlapped zone of the heat sink according to the third embodiment of the present invention. In this embodiment, the heat sink 30 comprises a top surface 30a, a bottom surface 30b, plural first fins 230 and plural second fins 330. The heat sink 30 further comprises plural heat pipes 530. Due to the heat pipes 530, the shape of the first fin 230 is correspondingly changed. Please refer to FIGS. 3A~3C. The plural heat pipes 530 are installed in the interior of the heat sink 30. The two ends of the heat pipe 530 are located at a high temperature side and a low temperature side, respectively. For increasing the heat dissipating efficiency, the heat is transferred from the high temperature side to the low temperature side through thermal conduction. The applications and the paths of the heat pipes 530 are well known to those skilled in the art while retaining the teachings of the invention, and are not redundantly described herein. It is noted that the positions of the first non-overlapped zone 231 and the second non-overlapped zone 232 of the heat sink 30 are not influenced by the heat pipes 530. As shown in FIGS. 3A~3C, the shape of the first non-overlapped zone 231 is modified according to the positions of the heat pipes 53. However, a greater portion of the first non-overlapped zone 231 is still on the lower-right side of the first fin 230, and a greater portion of the second non-overlapped zone 232 is still on the upper-left side of the first fin 230.

As shown in FIG. 3C, the first non-overlapped zone 231 has a first width WI31 and a second width WI32, and the second non-overlapped zone 232 has a first width WO31 and a second width WO32. The first width WI31 of the first non-overlapped zone 231 near the heated surface 411 is larger than the width WI32 of the first non-overlapped zone 231 away from the heated surface 411. Moreover, the first width WO31 of the second non-overlapped zone 232 near the heated surface 411 is smaller than the second width WO32 of the second non-overlapped zone 232 away from the heated surface 411. That is, the width of the first non-overlapped zone 231 is gradually increased from the top side to the bottom side, and the width of the second non-overlapped zone 232 is gradually increased from the bottom side to the top side. The ambient airflow W flows along the guiding direction A3. After the ambient airflow W flows into the heat sink 20 through a lower portion of the first space S1, the heat from the bottom surface 30b of the heat sink 30 is removed by the ambient airflow W and the heat is guided from the high temperature side to the low temperature side by the heat pipes 530. Consequently, the ambient airflow W is guided to be away from the heat sink 30 through an upper portion of the second space S2.

It is noted that numerous modifications and alterations may be made while retaining the teachings of the invention. For example, in another embodiment, the heat sink comprises plural fin groups. An example of the heat sink with plural fin groups will be described as follows.

Figure 4A:
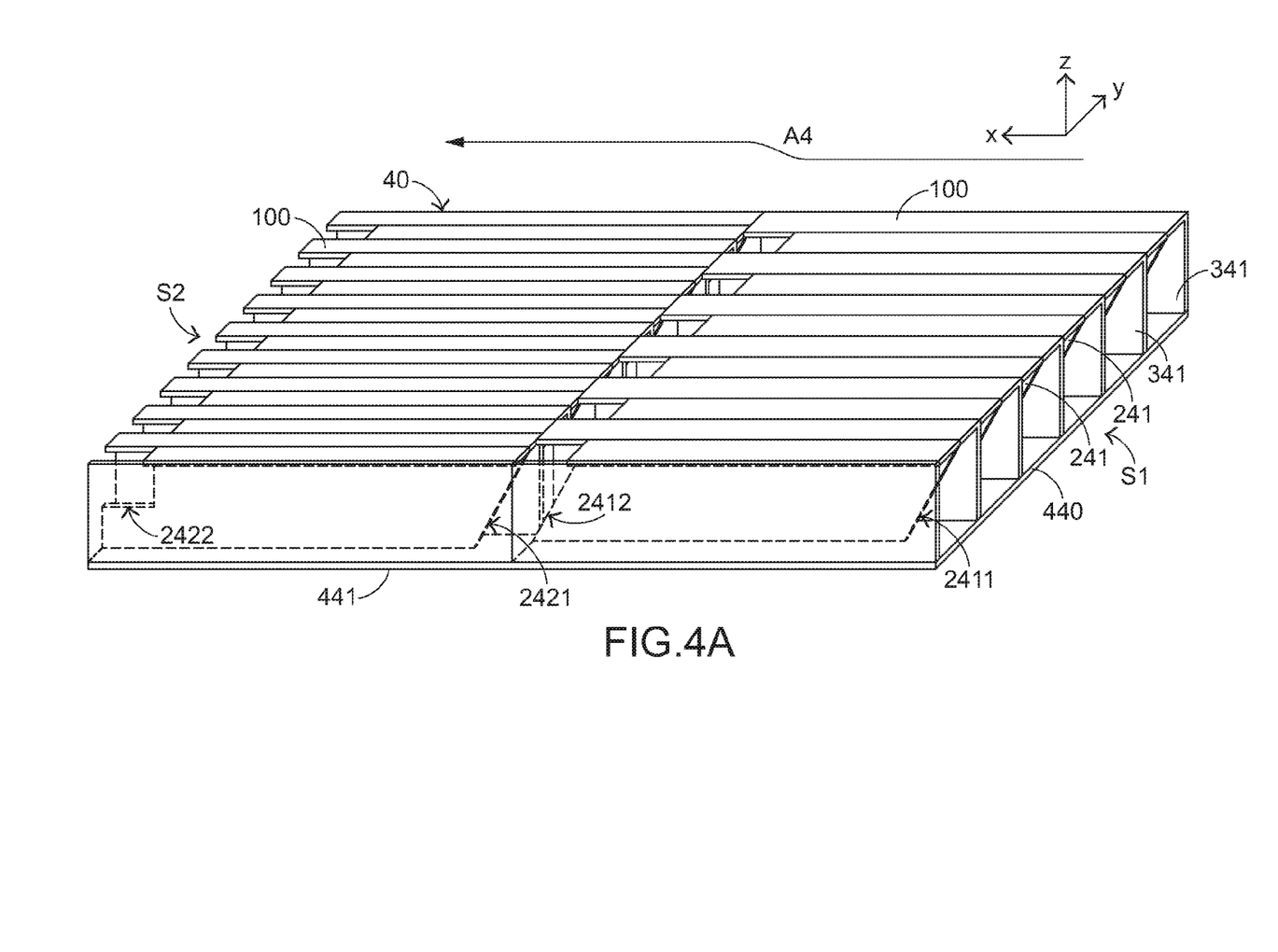
FIG. 4A is a schematic perspective view illustrating a heat sink with two fin groups according to a fourth embodiment of the present invention.
Figure 4B:
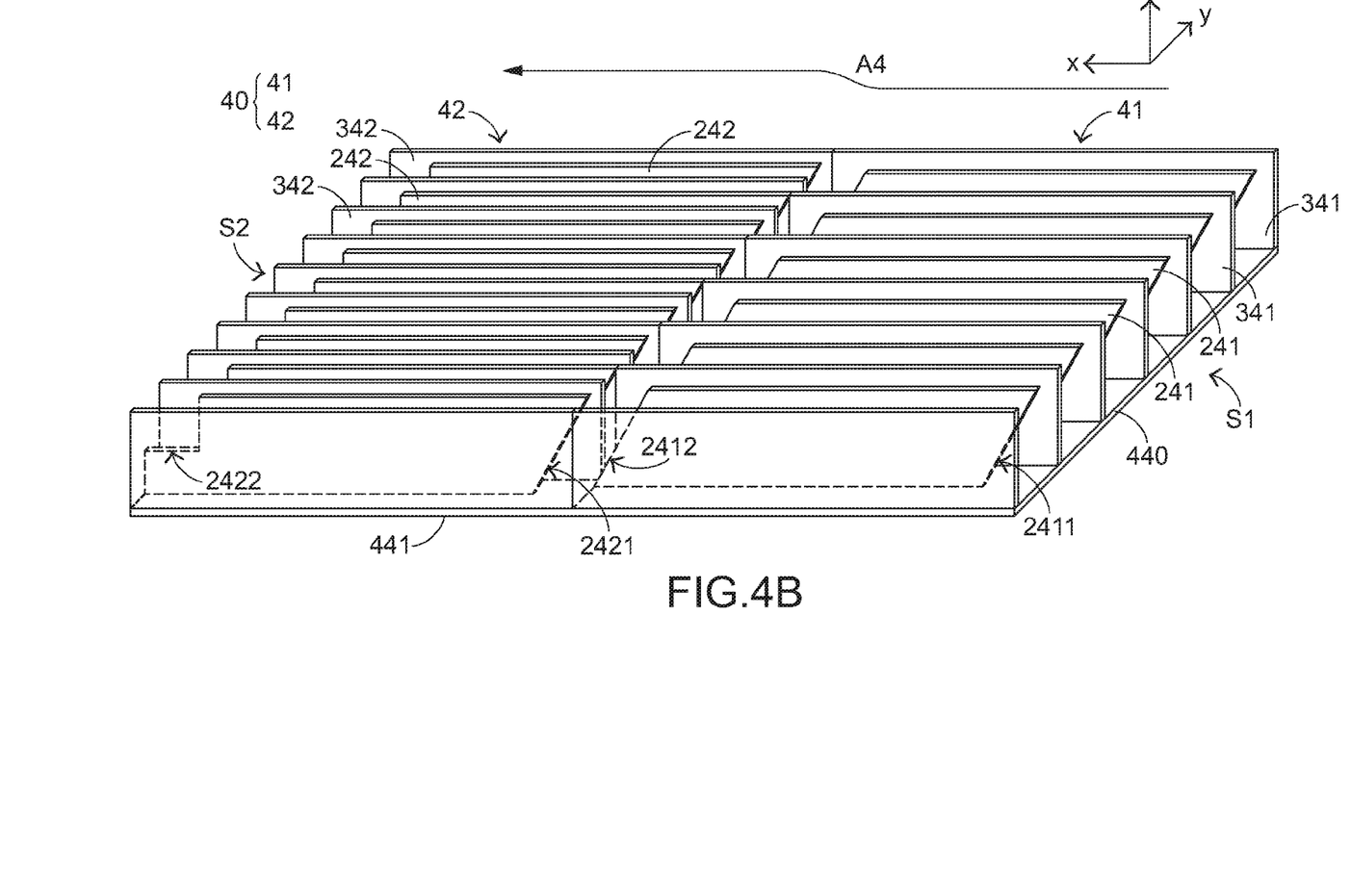
FIG. 4B is a schematic perspective view illustrating the heat sink of FIG. 4A, in which the bent structures are not shown.

FIG. 4A is a schematic perspective view illustrating a heat sink with two fin groups according to a fourth embodiment of the present invention. FIG. 4B is a schematic perspective view illustrating the heat sink of FIG. 4A, in which the bent structures are not shown. Since the bent structures are not included in FIG. 4B, the interiors of the two fin groups of the heat sink can be clearly shown.

Please refer to FIGS. 4A and 4B. In comparison with the above embodiments, the heat sink 40 of this embodiment comprises a first fin group 41 and a second fin group 42. The first fin group 41 and the second fin group 42 are designed according to the expanded concepts of the present invention. The additional second fin group 42 increases the overall heat transfer area of the heat sink. The structures of the first fin group 41 and the second fin group 42 will be described as follows.

Please refer to FIGS. 4A and 4B again. The first fin group 41 comprises plural first fins 241 and plural second fins 341, which are alternately and separately arranged. The first fin 241 of the first fin group 41 has a first non-overlapped zone 2411 and a second non-overlapped zone 2412. The structure of the first fin group 41 is similar to structure of the heat sink 20 of the second embodiment (see FIG. 2A). The second fin group 42 comprises plural first fins 242 and plural second fins 342, which are alternately and separately arranged. Similarly, the first fin 242 of the second fin group 42 has a first non-overlapped zone 2421 and a second non-overlapped zone 2422. Similarly, a greater portion of the first non-overlapped zone 2421 is on the lower-right side of the first fin 242, and a greater portion of the second non-overlapped zone 2422 is on the upper-left side of the first fin 242. According to the first non-overlapped zone 2411 and the second non-overlapped zone 2412 of the first fin group 41 and the first non-overlapped zone 2421 and the second non-overlapped zone 2422 of the second fin group 42, the ambient airflow flows along the guiding direction A4.

In this embodiment, the shapes of the first fins 241 of the first fin group 41 and the shapes of the first fins 242 of the second fin group 42 are different. It is noted that the numbers of the plural first fins 241 and 242 and the numbers of the plural second fins 341 and 342 may be varied. In other words, the fin densities of the first fin group 41 and the second fin group 42 are adjustable according to the heat dissipating demand of the product.

For example, the total number of the first fins 241 and the second fins 341 of the first fin group 41 is in the range between 30 and 40, and the total number of the first fins 242 and the second fins 342 of the second fin group 42 is in the range between 60 and 75. Under this circumstance, the fin density of the second fin group 42 is higher than the fin density of the first fin group 41.

In other words, the uses of plural fin groups can effectively increase the overall heat dissipating efficiency of the heat sink. Similarly, in case that the heat sink of the fourth embodiment is equipped with at least one heat pipe, the heat dissipating efficiency is further enhanced.

From the above descriptions, the present invention provides the heat sink. Due to the first non-overlapped zone and the second non-overlapped zone, the inlet pressure drop in the first space and the outlet pressure drop in the second space are reduced. Consequently, the velocity and flowrate of the ambient airflow are increased, and the heat transfer coefficient of the heat sink is enhanced. Moreover, since the velocity and flowrate of the ambient airflow are increased, the heat sink can further comprise the second fin group to increase the overall heat transfer area of the heat sink, or the heat sink can further comprise plural heat pipes to increase the thermal conductivity of the heat sink and the overall heat dissipating efficiency of the heat sink. Since the heat sink is in contact with the heat sink and the temperature at the airflow outlet is higher than the temperature at the airflow inlet, the positions of the first non-overlapped zone and the second non-overlapped zone of the first fin are specially determined. That is, the first non-overlapped zone is includes in the first space and located near the heated surface, and the second non-overlapped zone is included in the second space and located away from the heated surface. In the second space with higher temperature, the ambient airflow is contacted with the first fins, the second fins and the heated surface. Consequently, the overall heat dissipating efficiency is enhanced.

In the above embodiments, the heat sink is in close contact with the heated surface of the heat generation component, and thus the heat sink is connected with the heated surface directly. In some other embodiments, a thermally conductive layer or a thermal conductor is arranged between the heat sink and the heated surface, and thus the heat sink is connected with the heated surface indirectly.

While the invention has been described in terms of what is presently considered to be the most practical and preferred embodiments, it is to be understood that the invention needs not be limited to the disclosed embodiments. On the contrary, it is intended to cover diversified modifications and similar arrangements included within the spirit and scope of the appended claims which are to be accorded with the broadest interpretation so as to encompass all such modifications and similar structures.

What is claimed is:

1. A heat sink connected with a heated surface of a heat generation component, an ambient airflow flowing into the heat sink to remove heat from the heat generation component, the heat sink comprising:
    a bottom surface close to the heated surface;
    a top surface away from the heated surface and opposed to the bottom surface; and
    plural first fins and plural second fins alternately and separately arranged between the top surface and the bottom surface along a specified axis direction, wherein plural airflow channels are defined by the plural first fins, the plural second fins, the top surface and the bottom surface collaboratively, and each airflow channel comprises an airflow inlet and an airflow outlet,
    wherein an area of the first fin is larger than an area of the second fin, and the first fin has a first non-overlapped zone and a second non-overlapped zone with respect to a projection area of the second fin along the specified axis direction, wherein the first non-overlapped zone is located at the airflow inlet, and a first width of the first non-overlapped zone near the heated surface is larger than a second width of the first non-overlapped zone away from the heated surface, wherein the second non-overlapped zone is located at the airflow outlet, and a first width of the second non-overlapped zone near the heated surface is smaller than a second width of the second non-overlapped zone away from the heated surface.

2. The heat sink according to claim 1, wherein a first space at the airflow inlet is defined by each second fin and two adjacent first fins collaboratively, and a second space at the airflow outlet is defined by each second fin and two adjacent first fins collaboratively, wherein after the ambient airflow flows into the heat sink through the first space, the ambient airflow is guided to the heated surface, wherein after the ambient airflow passes through the heat sink, the ambient airflow is away from the heated surface through the second space.

3. The heat sink according to claim 1, wherein the first fins and the second fins comprise plural bent structures, and the bottom surface and the top surface are defined by the plural bent structures collaboratively.

4. The heat sink according to claim 1, wherein the first fins are rectangular fins, and the second fins are parallelogram-shaped fins.

5. The heat sink according to claim 1, wherein the heat sink further comprises at least one heat pipe, and the at least one heat pipe is penetrated through and connected with the plural first fins and the plural second fins.

6. The heat sink according to claim 5, wherein a first end of the heat pipe is near the heated surface, and a second end of the heat pipe is away from the heated surface.

* * * * *